(12) United States Patent
Kimura

(10) Patent No.: US 10,996,730 B2
(45) Date of Patent: May 4, 2021

(54) ELECTRONIC DEVICE INCLUDING POWER SUPPLY AND METHOD TO BE EXECUTED BY ELECTRONIC DEVICE

(71) Applicant: Yoshitaka Kimura, Tokyo (JP)

(72) Inventor: Yoshitaka Kimura, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 173 days.

(21) Appl. No.: 16/352,891

(22) Filed: Mar. 14, 2019

(65) Prior Publication Data
US 2019/0286204 A1 Sep. 19, 2019

(30) Foreign Application Priority Data

Mar. 15, 2018 (JP) .............................. JP2018-048530
Mar. 5, 2019 (JP) .............................. JP2019-039148

(51) Int. Cl.
*G06F 1/26* (2006.01)
*G06F 1/18* (2006.01)
*H03K 17/693* (2006.01)

(52) U.S. Cl.
CPC .............. *G06F 1/266* (2013.01); *G06F 1/188* (2013.01); *H03K 17/693* (2013.01); *H03K 2217/0081* (2013.01)

(58) Field of Classification Search
CPC ................................................... G06F 1/263
See application file for complete search history.

(56) References Cited

U.S. PATENT DOCUMENTS

| | | | | |
|---|---|---|---|---|
| 2007/0022311 A1* | 1/2007 | Park | .................. | G06F 1/266 713/310 |
| 2008/0278436 A1* | 11/2008 | Sato | .................. | G09G 3/344 345/107 |
| 2009/0006686 A1* | 1/2009 | Kimura | ............... | G06F 13/4295 710/106 |
| 2011/0125929 A1* | 5/2011 | James | .................. | G06F 3/01 710/8 |
| 2012/0019193 A1* | 1/2012 | Yu | .................. | G06F 1/28 320/103 |
| 2012/0044405 A1 | 2/2012 | Kimura et al. | | |
| 2013/0201390 A1 | 8/2013 | Asakura et al. | | |
| 2014/0164805 A1* | 6/2014 | Hasui | .................. | G06F 1/266 713/323 |

(Continued)

FOREIGN PATENT DOCUMENTS

JP   2018-007451   1/2018

*Primary Examiner* — Jaweed A Abbaszadeh
*Assistant Examiner* — Cheri L Harrington
(74) *Attorney, Agent, or Firm* — Oblon, McClelland, Maier & Neustadt, L.L.P.

(57) ABSTRACT

An electronic device includes a power supply, a connector, a detector, and a switch. The connector is configured to be alternatively connectable in a first direction and in a second direction. The detector is configured to detect which of the first direction and the second direction the connector has been connected in. The switch is configured to switch a state of the electronic device between a first state to supply power to another device and to a second state to receive power from said another device. The switch is configured to switch the state of the electronic device to the first state or the second state according to a connection direction of the connector detected by the detector.

9 Claims, 6 Drawing Sheets

(56) References Cited

U.S. PATENT DOCUMENTS

| | | | |
|---|---|---|---|
| 2015/0280478 A1* | 10/2015 | Nonogaki | H02J 7/342 |
| | | | 320/103 |
| 2016/0037212 A1* | 2/2016 | Dong | H04N 21/4402 |
| | | | 348/441 |
| 2016/0216757 A1* | 7/2016 | Kim | G06F 1/3212 |
| 2017/0139467 A1* | 5/2017 | Waters | G06F 13/4282 |
| 2017/0142536 A1* | 5/2017 | Hattori | H04S 7/301 |
| 2017/0163074 A1 | 6/2017 | Kimura | |
| 2018/0004277 A1* | 1/2018 | Matsui | G06F 1/3287 |
| 2018/0032350 A1* | 2/2018 | Lee | G06F 1/266 |
| 2018/0069395 A1* | 3/2018 | Morii | H01B 7/36 |
| 2018/0070034 A1 | 3/2018 | Kimura | |
| 2018/0181177 A1* | 6/2018 | Fukute | H04N 5/23241 |
| 2018/0292880 A1* | 10/2018 | Nakadokoro | G06F 1/266 |
| 2019/0036257 A1* | 1/2019 | Lim | G06F 13/4081 |
| 2019/0165428 A1* | 5/2019 | Nozaki | H01M 10/44 |
| 2019/0294228 A1* | 9/2019 | Tamura | G06F 1/3287 |
| 2019/0308637 A1* | 10/2019 | Shinoda | B60W 50/06 |
| 2019/0312448 A1* | 10/2019 | Lim | H02J 7/0027 |

* cited by examiner

ELECTRONIC DEVICE INCLUDING POWER SUPPLY AND METHOD TO BE EXECUTED BY ELECTRONIC DEVICE

CROSS-REFERENCE TO RELATED APPLICATIONS

This patent application is based on and claims priority pursuant to 35 U.S.C. § 119(a) to Japanese Patent Application Nos. 2018-048530, filed on Mar. 15, 2018, and 2019-039148, filed on Mar. 5, 2019 in the Japan Patent Office, the entire disclosure of each of which is incorporated by reference herein.

BACKGROUND

Technical Field

Aspects of the present disclosure relate to an electronic device including a power supply and a method to be executed by the electronic device including the power supply.

Related Art

Electronic devices are known that include a power supply compatible with universal serial bus (USB)-power delivery (PD). For example, an electronic device is a dual-role power (DRP) device having a DRP port that enables selective execution of power supply and power reception, and includes a configuration channel (cc) terminal for recognizing connection between devices.

The cc terminal is alternatively connected to a pull-up resistor and a pull-down resistor. In each DRP device, the connection between the cc terminal and the pull-up/pull-down resistor is periodically and alternately switched. Therefore, one DRP device is determined as a source (that is a port having a role of supplying power and having the cc terminal connected to the pull-up resistor), and the other DRP device is determined as a sink (that is a port having a role of receiving the power and having the cc terminal connected to the pull-down resistor) according to timing when the DRP devices are connected via a USB cable.

When the DRP devices are connected, a power transmission direction between the DRP devices may be determined to be a reverse direction to a direction intended by a user depending on the connection timing (in other words, a state of the cc terminals of the DRP devices at the time of connection).

SUMMARY

In an aspect of the present disclosure, there is provides an electronic device that includes a power supply, a connector, a detector, and a switch. The connector is configured to be alternatively connectable in a first direction and in a second direction. The detector is configured to detect which of the first direction and the second direction the connector has been connected in. The switch is configured to switch a state of the electronic device between a first state to supply power to another device and to a second state to receive power from said another device. The switch is configured to switch the state of the electronic device to the first state or the second state according to a connection direction of the connector detected by the detector.

BRIEF DESCRIPTION OF THE DRAWINGS

The aforementioned and other aspects, features, and advantages of the present disclosure would be better understood by reference to the following detailed description when considered in connection with the accompanying drawings, wherein.

Figure 1:
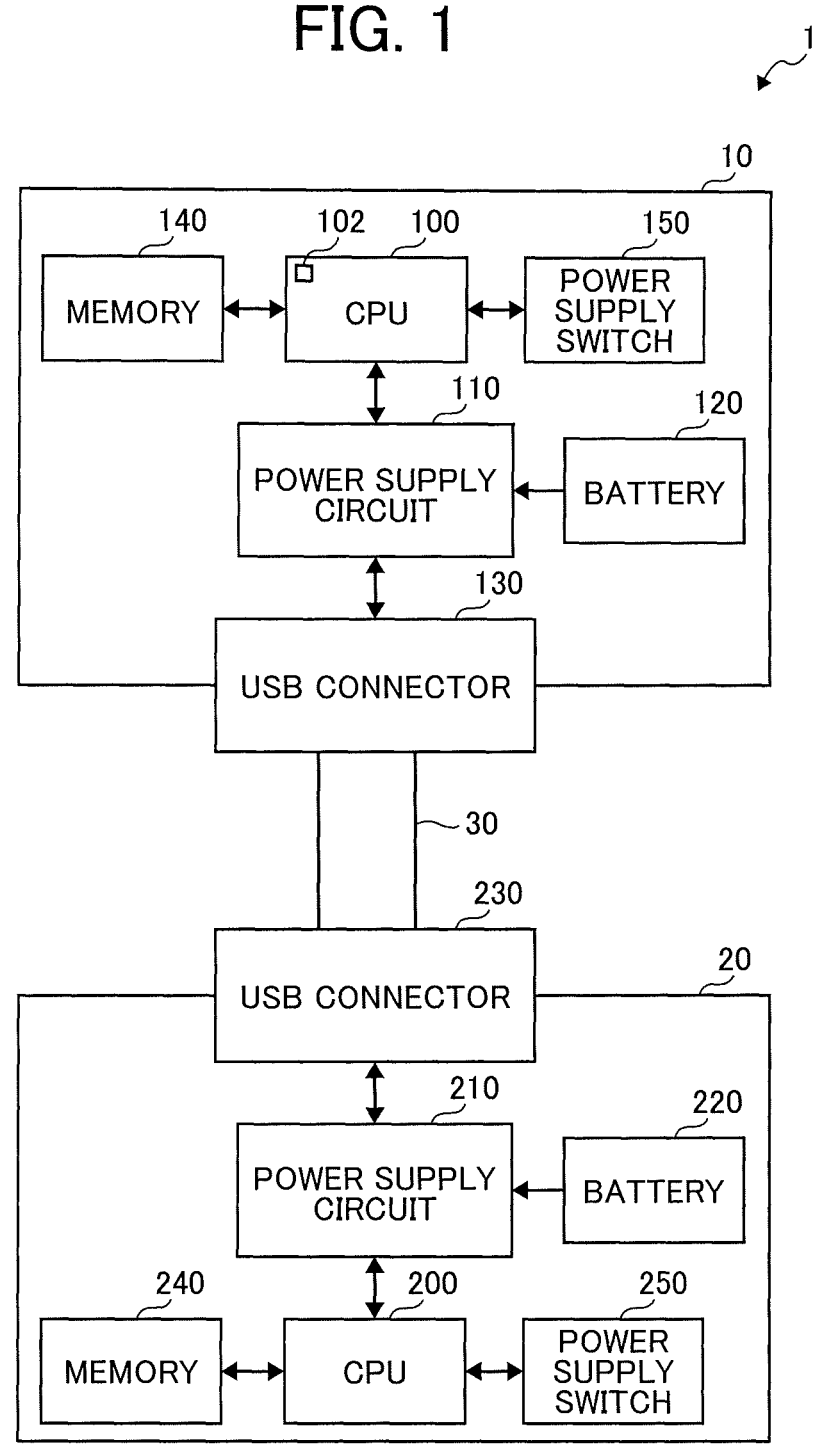
FIG. 1 is a block diagram illustrating a configuration of a power supply system according to an embodiment of the present invention.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, a power supply system according to an embodiment of the present invention will be described with reference to the drawings.

FIG. 1 is a block diagram illustrating a configuration of a power supply system 1 according to an embodiment of the present invention. The power supply system 1 includes at least two devices (electronic devices including power supplies). In the example of FIG. 1, the power supply system 1 includes a device 10 and a device 20.

The devices 10 and 20 constituting the power supply system 1 can supply power and receive power according to a result of communication between the devices. That is, the devices 10 and 20 are operable as power supply devices and are illustratively DRP devices each having a DRP port compatible with USB-PD.

Specific examples of the devices 10 and 20 include a digital single lens reflex camera, a mirrorless single lens camera, a compact digital camera, a video camera, a monitoring camera, a camcorder, a desktop personal computer (PC), a notebook PC, a tablet terminal, a personal handy phone system (PHS), a smartphone, a smart watch, a feature phone, a game machine, a music player, a television (TV), various peripherals such as a mobile battery, a projector, a printer, and a storage, and various accessories such as a strobe, a global positioning system (GPS) unit, and an external finder.

Since the devices 10 and 20 are DRP devices, the devices 10 and 20 can serve as sources and sinks. In the present embodiment, for the sake of convenience, a device-specific configuration (for example, a solid-state image pickup device or a photographing lens in the case of a digital single lens reflex camera, a monitor display or a hard disk drive (HDD) in the case of a PC, a flash lamp or a trigger circuit in the case of a strobe, or the like) or a general configuration such as a housing, which allows omission of description, is omitted or simplified as appropriate in illustration and description.

As illustrated in FIG. 1, the device 10 includes a central processing unit (CPU) 100, a power supply circuit 110, a battery 120, a USB connector 130, a memory 140, and a power supply switch 150.

When a user presses the power supply switch 150, the power supply circuit 110 supplies power to each part of the device 10. A power supply source to the power supply circuit 110 is, for example, the battery 120 or a commercial power supply. The device 10 basically operates with the power supplied from the battery 120, but when the device 10 is connected to the commercial power supply, the operation is switched to an operation with the power supplied from the commercial power supply.

The CPU 100 accesses the memory 140, reads out a control program, loads the control program in a work area, and executes the loaded control program to comprehensively control the entire device 10.

The USB connector 130 is a connector conforming to the USB-PD standard, and is, for example, a USB Type-C connector. One end of a USB cable 30 is connected to the USB connector 130. The USB cable 30 is a cable conforming to the USB-PD standard, and is, for example, a USB Type-C cable.

As illustrated in FIG. 1, the device 20 includes a CPU 200, a power supply circuit 210, a battery 220, a USB connector 230, a memory 240, and a power supply switch 250. For the device 20, for the sake of convenience, description of portions overlapping with the device 10 is simplified or omitted as appropriate.

The USB connector 230 is a connector conforming to the USB-PD standard, and is, for example, a USB Type-C connector. The other end of the USB cable 30 is connected to the USB connector 230.

In the USB cable 30, a virtual bus (VBUS) line connecting a VBUS terminal of the device 10 and a VBUS terminal of the device 20, and a ground (GND) line connecting a GND terminal of the device 10 and a GND terminal of the device 20 are provided as power supply lines. Further, a configuration channel (cc) line for recognizing connection between the devices is provided inside the USB cable 30.

Figure 2:
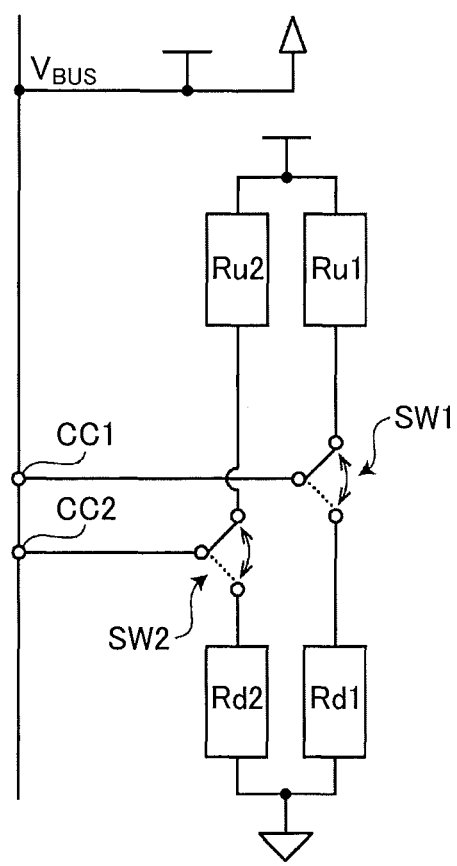
FIG. 2 is a diagram schematically illustrating a configuration around a connecting portion of a device provided in the power supply system according to the embodiment of the present invention.

FIG. 2 schematically illustrates a configuration around a connecting portion of the device 10 connected to the USB cable 30. Specifically, FIG. 2 illustrates the USB connector 130 and a partial circuit (for example, a partial circuit in the power supply circuit 110) in the device 10 located at a rear stage of the USB connector 130. Note that a configuration around a connecting portion of the device 20 as a DRP device is also similarly configured to the device 10. For this reason, illustration of the configuration around the connecting portion of the device 20 is omitted.

Since the USB connector 130 or 230 is a USB Type-C connector, the USB connector 130 or 230 is a connecting portion that can be reversibly connected in two opposite directions (alternatively connected in a first direction and a second direction). To enable the reversible connection, each connector of the USB connector 130 or 230 is provided with a pair of cc terminals (a cc1 terminal and a cc2 terminal). When the connectors are connected in one direction, the cc1 terminal of the device 10 and the cc1 terminal of the device 20 are connected via the USB cable 30 (cc line), for example, and when the connectors are connected in the other direction, the cc2 terminal of the device 10 and the cc1 terminal of the device 20 are connected via the cc line, for example. In the devices 10 and 20, the connection direction of the USB connectors 130 and 230 is detected from a combination of the cc terminals connected via the cc line.

The cc1 terminal can be selectively connected to the pull-up resistor Ru1 and the pull-down resistor Rd1. The cc1 terminal is connected to the pull-up resistor Ru1 and the pull-down resistor Ru1 while the power supply and the power reception are not being performed with another electronic device corresponding to the USB-PD (for example, during the period when it is not connected to another electronic device) Is periodically and alternately connected to one of the resistors by the operation of the changeover switch SW1 provided between the resistor Rd1. The cc2 terminal can alternatively be connected to the pull-up resistor Ru2 and the pull-down resistor Rd2 during the above period. The terminal cc2 is cyclically and alternately connected to one of the resistors by the operation of the changeover switch SW2 provided between the pull-up resistor Ru2 and the pull-down resistor Rd2.

In each device, the connection between the cc terminal and the pull-up/pull-down resistor is periodically and alternately switched by the changeover switch SW that operates as a switch. Therefore, a source (that is a port having a role of supplying the power and is a device having the cc terminal connected to the pull-up resistor at this point of time) and a sink (that is a port having a role of receiving the power and is a device having the cc terminal connected to the pull-down resistor at this point of time) are determined according to timing when the device 10 and the device 20 are connected via the USB cable 30.

Supplementarily, when the devices are connected via the cc line, a potential of the cc terminal varies due to voltage division by the pull-up resistor and the pull-down resistor of each device. With the variation of the potential, the device 10 and the device 20 detect the mutual connection and stop switching operations of the changeover switches SW. That is, the device determined as the source maintains the state in which the cc terminal is connected to the pull-up resistor, and the device determined as the sink maintains the state in which the cc terminal is connected to the pull-down resistor.

When the device 10 and the device 20 detect the mutual connection, a power supply voltage (5 V) is supplied from the source to the sink via the VBUS lines. Next, negotiation is performed between the source and the sink. With this negotiation, one profile is selected from among a plurality of profiles (combinations of a voltage suppliable by the source and a maximum current), and setting of the power supply voltage by the VBUS line is changed from 5 V as required according to the selected profile. When the negotiation is completed, 5 V or the power supply voltage after the setting change is supplied from the source to the sink.

As described above, in the DRP device having the conventional configuration, a switching operation with an operation unit is performed to switch the power transmission direction between the DRP devices to the direction intended by the user in the case where the power transmission direction between the DRP devices is determined to be the reverse direction to the direction intended by the user. In contrast, the device 10 according to the present embodiment can switch the power transmission direction between the device 10 and the device 20 to the direction intended by the user without using the operation unit.

First Example

Figure 3:
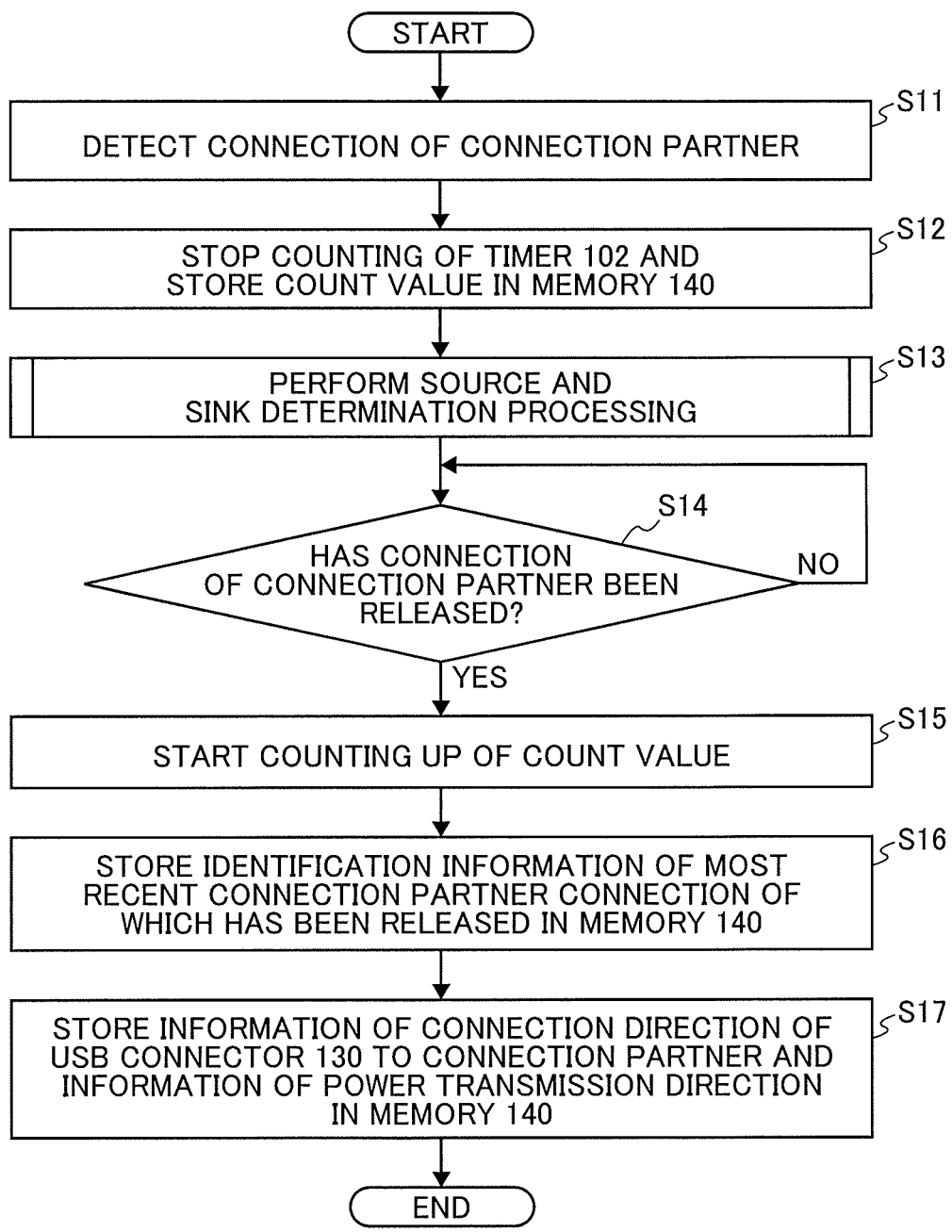
FIG. 3 is a flowchart regarding control of a power transmission direction between a device and a connection partner, the control being executed by the device in a first example of the present invention.

FIG. 3 illustrates a flowchart regarding control of the power transmission direction between the device 10 and a connection partner (for example, the device 20), the control being executed by the device 10 (mainly the CPU 100) in a first example of the present invention.

As described above, when the DRP devices are connected via the cc line, the potential of the cc terminal varies due to voltage division by the pull-up resistor and the pull-down resistor of each device. With the variation of the potential, the CPU 100 detects that the connection partner (DRP device) has been connected (step S11).

A timer 102 is built in the CPU 100. The timer 102 counts an elapsed time from when the previous connection of the connection partner (DRP device) to the device 10 has been released. The CPU 100 stops the counting with the timer 102 when detecting the connection of the DRP device (step S11), stores a count value (that is, the above-described elapsed time) to the memory 140, and resets the count value to zero (step S12). That is, the timer 102 operates as a timer that measures the elapsed time from when the previous connection of the connection partner has been released to when a current connection with another device is established.

Figure 4:
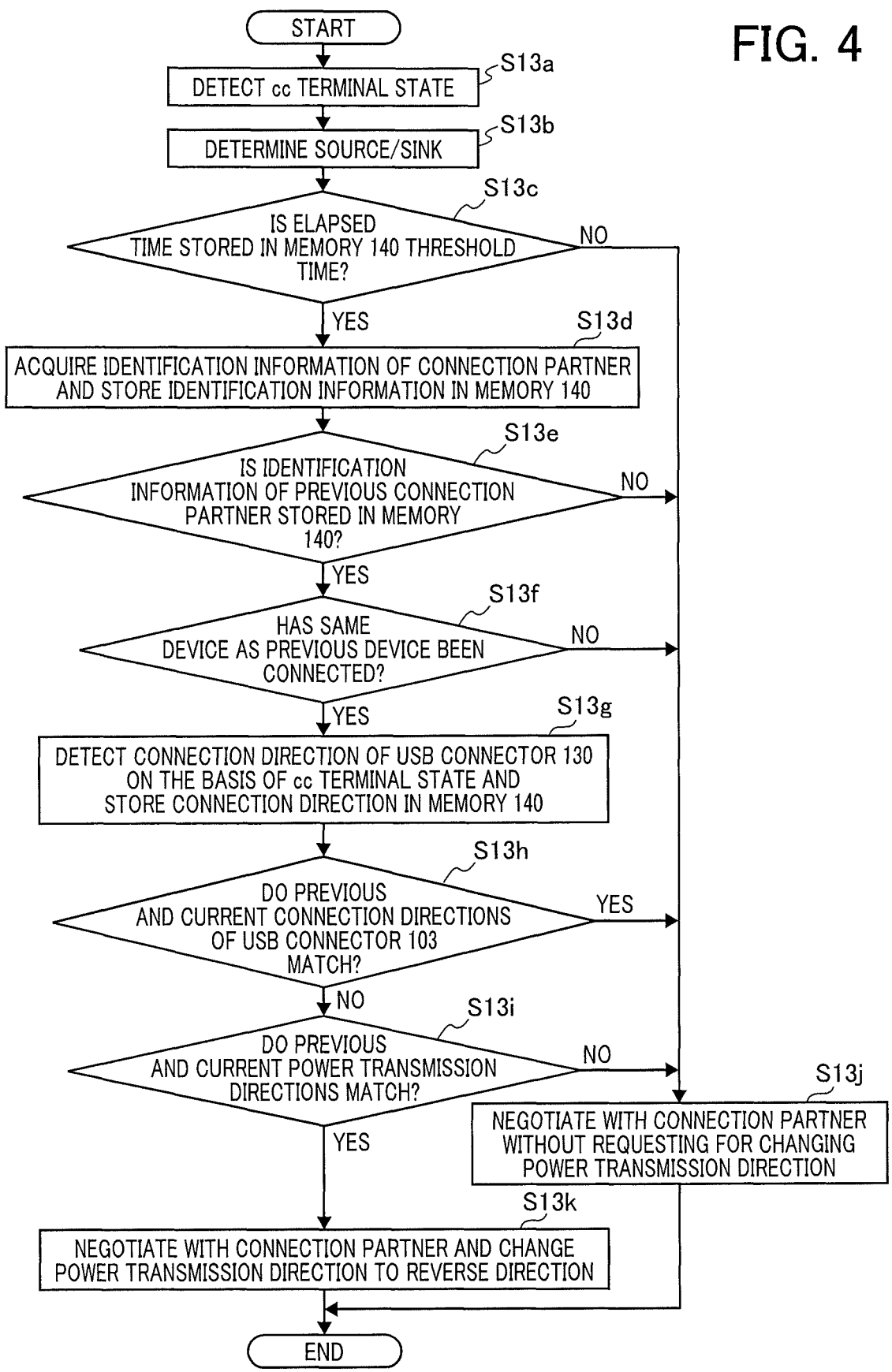
FIG. 4 is a flowchart illustrating details of step S13 (source and sink determination processing) in FIG. 3.

Source and sink determination processing (step S13) is executed. FIG. 4 illustrates details of step S13 (source and sink determination processing) in FIG. 3.

As illustrated in FIG. 4, the CPU 100 detects the states of the cc1 terminal and the cc2 terminal (step S13a) and determines the device 10 as the source or the sink from the detected states of the cc1 terminal and the cc2 terminal (step S13b). Likewise, the DRP device of the connection partner is determined as the source or the sink.

For example, in a case where the devices 10 and 20 are determined as the source and the sink, respectively, the power transmission direction is determined as a direction from the device 10 to the device 20. In a case where the devices 10 and 20 are determined as the sink and the source, respectively, the power transmission direction is determined as a direction from the device 20 to the device 10. However, this power transmission direction may not be the direction intended by the user. Therefore, the processing of step S13c and subsequent steps is executed.

The CPU 100 determines whether the elapsed time stored in the memory 140 is equal to or less than a predetermined time (step S13c). When the CPU 100 determines that the elapsed time stored in the memory 140 is equal to or less than the predetermined time (step S13c: YES), the CPU 100 acquires identification information of the connection partner and stores the identification information in the memory 140 (step S13d). For example, the identification information is stored in the memory 140 in the case where the connection partner is a DRP device.

Identification information of the previous connection partner is stored in the memory 140 in addition to the identification information of the current connection partner (see step S16 to be described below). Note that, in a case where the device 10 has not been connected to any of devices compatible with USB-PD, no identification information of the previous connection partner is stored in the memory 140.

The CPU 100 determines whether the identification information of the previous connection partner is stored in the memory 140 (step S13e). When the CPU 100 determines that the identification information of the previous connection partner is stored in the memory 140 (step S13e: YES), the CPU 100 determines whether the identification information of the current connection partner matches the identification information of the previous connection partner, that is, whether the same device as the previous device is connected to the device 10 (step S13f).

When the CPU 100 determines that the same device as the previous device has been connected to the device 10 (step S13f: YES), the CPU 100 detects the connection direction of the USB connector 130 according to the state of the cc terminal and stores the connection direction in the memory 140 (step S13g).

Figure 5A:
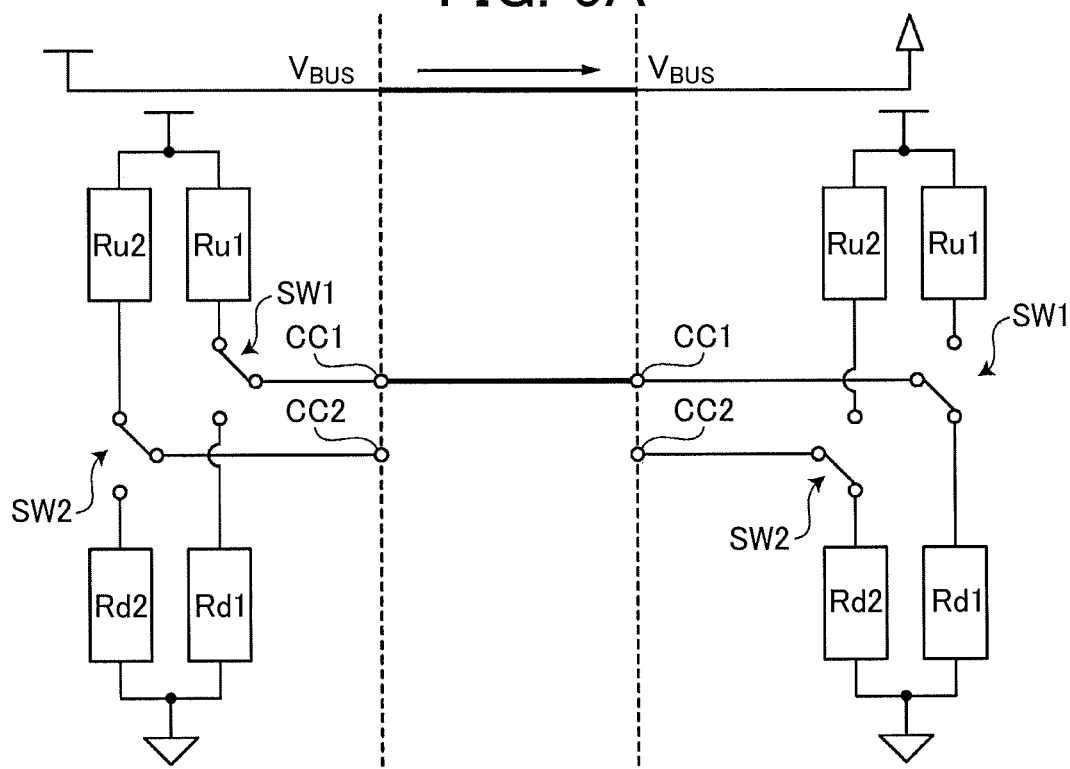
FIGS. 5A and 5B are diagrams for supporting description of a connection direction of a USB connector provided in a device in a first example of the present invention.
Figure 5B:
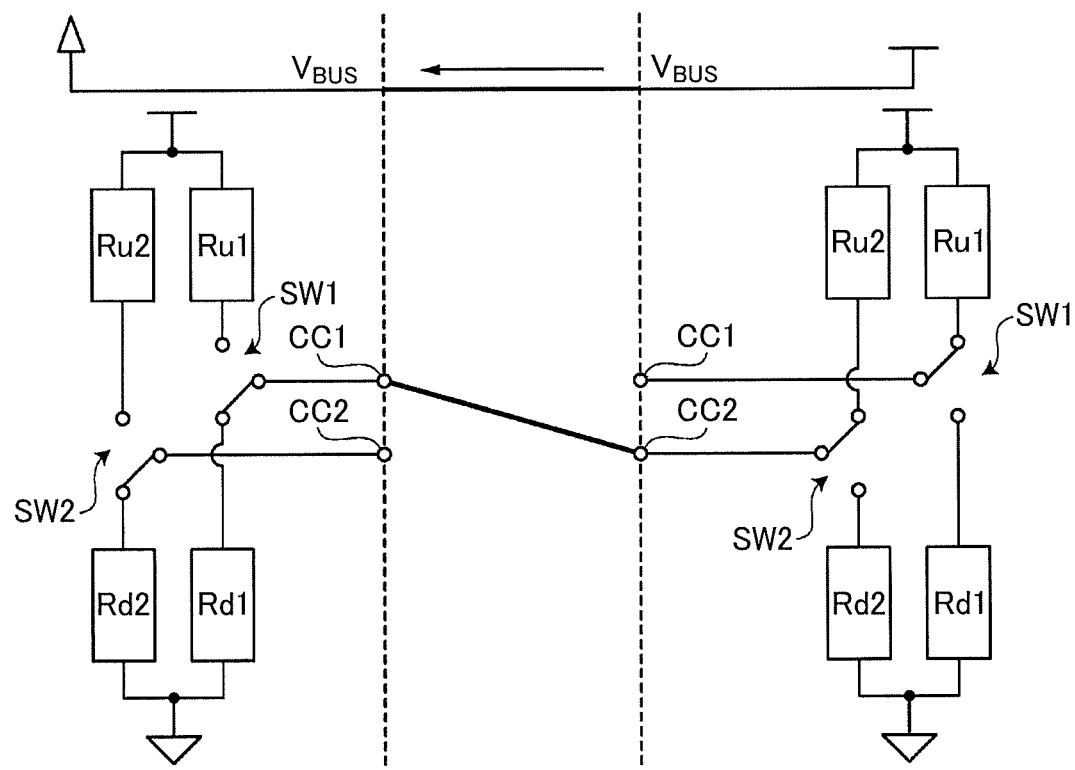

Description of the connection direction of the USB connector 130 will be supplemented with reference to FIGS. 5A and 5B. FIGS. 5A and 5B illustrate connection patterns of the cc terminals when the device 10 and the device 20 are connected.

In the example of FIG. 5A, the cc1 terminal of the device 10 and the cc1 terminal of the device 20 are connected. In the case where the cc1 terminal of the device 10 is connected to the device 20 via the cc line, the connection is expressed in such a way that the USB connector 130 is connected "face up" to the device 20. In the example of FIG. 5B, the cc2 terminal of the device 10 and the cc1 terminal of the device 20 are connected. In the case where the cc2 terminal of the device 10 is connected to the device 20 via the cc line, the connection is expressed in such a way that the USB connector 130 is connected "face down" to the device 20.

That is, in step S13g, the CPU 100 operates as a detector that detects whether the USB connector 130 is connected either face up or face down to the device 20 via the USB cable 30. In the example of FIG. 5A, the CPU 100 detects that the connection direction of the USB connector 130 is face up. In the example of FIG. 5B, the CPU 100 detects that the connection direction of the USB connector 130 is face down.

Information of the connection direction of the USB connector 130 to the previous connection partner is stored in the memory 140 (see step S17 to be described below). The CPU 100 determines whether the connection direction of the USB connector 130 to the previous connection partner matches the connection direction of the USB connector 130 to the current connection partner (step S13h).

Consider a case where the connection direction of the USB connector 130 to the previous connection partner does not match the connection direction of the USB connector 130 to the current connection partner. In this case, the user reconnects the same device as the previous device to the USB connector 130 in the reverse connection direction to the previous direction before the predetermined time elapses after the previous connection of the devices has been released. As an example, the user removes the device 10 from the USB connector 130 and immediately reconnects the device 10 to the USB connector 130 in the reverse connection direction to the previous direction.

In the first example, the user's act of connecting the same device as the previous device to the USB connector 130 in the reverse connection direction to the previous direction is treated as indication of intention that the user wishes to change the current power transmission direction to the reverse direction (in other words, the user wishes to swap the source and the sink). Therefore, in a case where the previous connection direction of the USB connector 130 is different from the current connection direction of the USB connector 130 (step S13h: NO), the CPU 100 determines whether the current (this time) power transmission direction matches the previous power transmission direction stored in the memory 140 (step S13i). When the CPU 100 determines that the previous power transmission direction matches the current power transmission direction (step S13i: YES), in step S13k, the CPU 100 negotiates with the connection partner, requests the connection partner to change the power transmission direction, and changes the power transmission direction to the reverse direction (in other words, swaps the source and the sink) through communications with the connection partner in response to the change request. In a case where the CPU 100 determines that the previous power transmission direction does not match the current power transmission direction (step S13i: NO), in step S13j, the CPU 100 negotiates with the connection partner but does not request the connection partner to change the power transmission direction (in other words, does not request the connection partner to swap the source and the sink) because the power transmission direction has already been the reverse direction to the previous direction.

The description of step S13k will be supplemented with reference to FIGS. 5A and 5B. In the example of FIG. 5A, the cc1 terminal of the device 10 is connected to the pull-down resistor Rd1 and the cc1 terminal of the device 20 is connected to the pull-up resistor Ru1. Therefore, the device 10 serves as the sink and the device 20 serves as the source, and the power supply voltage (5 V) is supplied from the device 20 to the device 10 via the VBUS line. When the connection direction of the USB connector 130 is changed to the different direction (here, the direction is changed from face up (see FIG. 5A) to face down (see FIG. 5B), and in the case where the previous power transmission direction matches the current power transmission direction, the negotiation is performed, and the cc2 terminal of the device 10 is connected to the pull-up resistor Ru2 and the cc1 terminal of the device 20 is connected to the pull-down resistor Rd1. Therefore, the devices 10 and 20 are swapped to the source and the sink, respectively, and the power transmission direction is changed to the reverse direction (in the direction from the device 10 to the device 20).

Consider a case where the connection direction of the USB connector 130 to the previous connection partner matches the connection direction of the USB connector 130 to the current connection partner. In this case, the user reconnects the same device as the previous device to the USB connector 130 in the same connection direction as the previous direction before the predetermined time elapses after the previous connection of the devices has been released.

In the first example, the user's act of connecting the same device as the previous device to the USB connector 130 in the same connection direction as the previous direction is treated as no indication of intention that the user wishes to change the current power transmission direction (in other words, the user wishes to swap the source and the sink). Therefore, in the case where the previous connection direction of the USB connector 130 matches the current connection direction of the USB connector 130 (step S13h: YES), in step S13j, the CPU 100 negotiates with the connection partner but does not request the connection partner to change the power transmission direction (in other words, does not request the connection partner to swap the source and the sink).

Note that, in the first example, the elapsed time stored in the memory 140 exceeds the predetermined time (step S13c: NO), a certain time has elapsed since the previous connection of the devices was released. Therefore, there is a relatively high possibility that the user does not grasp the previous connection direction. In this case, the CPU 100 negotiates with the connection partner but does not request the connection partner to change the power transmission direction (step S13j).

In a modification of the first example, the determination processing in step S13c may be omitted. That is, the above-described elapsed time may be excluded from a determination factor as to whether to change the power transmission direction to the reverse direction.

Further, in the first example, in the case where the identification information of the previous connection partner is not stored in the memory 140 (step S13e: NO) and in the case where the identification information of the current connection partner does not match the identification information of the previous connection partner (step S13f: NO), the CPU 100 negotiates with the connection partner but does not request the connection partner to change the power transmission direction (step S13j). Note that, in the modification of the first example, the determination processing of step S13f may be omitted.

Note that the processing of determining the elapsed time (step S13c), the presence or absence of the identification information (step S13e), the connected device (step S13f), the connection direction (step S13h), and the power transmission direction (step S13i) may be executed in a different order from the order illustrated in FIG. 4.

When the source and sink determination processing (step S13) is completed, the CPU 100 executes step S14 and subsequent steps in FIG. 3.

The CPU 100 determines whether the connection of the connection partner to the device 10 is released (step S14). When the CPU 100 determines that the connection of the connection partner to the device 10 has been released (step S14: YES), the CPU 100 starts counting up of the count value that has been reset to zero to count the elapsed time (step S15).

The CPU 100 operates as a memory. Specifically, the CPU 100 stores the identification information of the most recent connection partner, the connection of which has been released, in the memory 140 (step S16), and also stores the information of the connection direction of the USB connector 130 to the connection partner and the information of the power transmission direction in the memory 140 (step S17).

Note that the user may individually store the identification information of the connection partner in the memory 140 using an operation member (not illustrated).

For example, an electronic device may display that a DRP device is in a power transmission state or in a power reception state on a display screen, and switch the power transmission state and the power reception state according to a touch operation on the display screen. Therefore, the user can check the display screen and perform the touch operation on the display screen to switch the power transmission direction between the DRP devices to the intended direction in the case where the power transmission direction between the DRP devices is the reverse direction to the intended direction.

Such an electronic device includes an operation unit (e.g., a touch panel) to switch the power transmission direction between DRP devices to a direction intended by a user. However, DRP devices (for example, mobile battery) may not be provided with the operation unit. Such a configuration would hamper the user from switching the power transmission direction between DRP devices to the intended direction.

As described above, in the first example, the power transmission direction between the device and the connection partner can be switched to the direction intended by the user without using an operation unit. In addition, in the first example, in switching the power transmission direction between the device and the connection partner to the direction intended by the user, a display such as a display screen can be obviated.

Supplementarily, in the first example, even when the connection direction of the USB connector 130 of the device 10 is switched, the connection direction of the USB connector (for example, the USB connector 230 of the device 20) of the connection partner is not switched. Accordingly, when the connection direction of the USB connector 130 of the device 10 is switched, the device 10 requests the connection partner to change the power transmission direction, but the connection partner does not request the device 10 to change the power transmission direction.

Second Example

Figure 6:
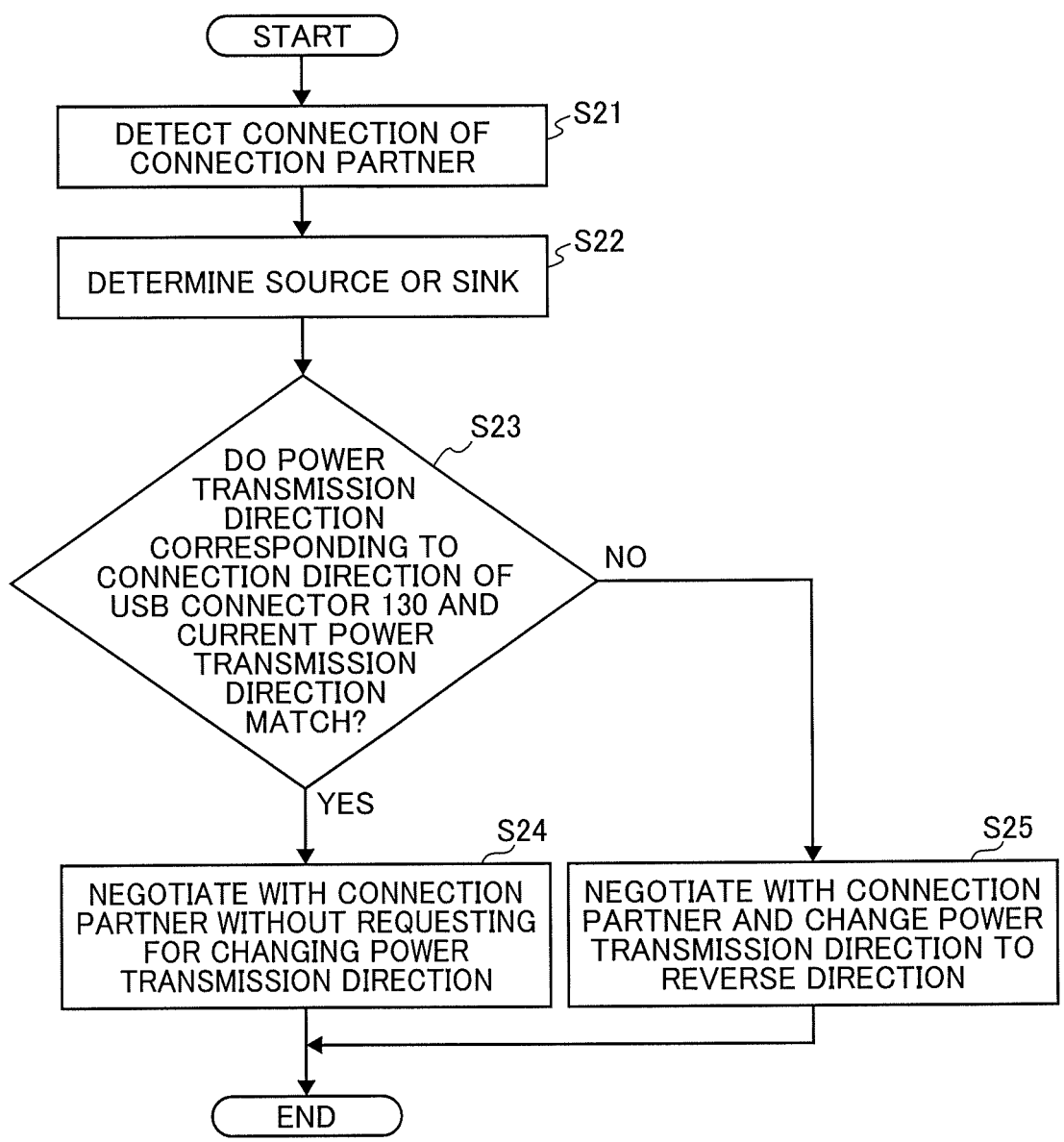
FIG. 6 is a flowchart regarding control of a power transmission direction between a device and a connection partner, the control being executed by the device in a second example of the present invention.

FIG. 6 illustrates a flowchart regarding control of the power transmission direction between the device 10 and the connection partner, the control being executed by the device 10 in a second example of the present invention. In the second example, for the sake of convenience, description of portions overlapping with the first example is simplified or omitted as appropriate.

The CPU 100 detects the variation of the potential of the cc terminal due to the voltage division by the pull-up resistor and the pull-down resistor to detect that the connection partner (DRP device) has been connected (step S21), and determines the device 10 as the source or the sink from the states of the cc1 terminal and the cc2 terminal (step S22). Likewise, the connection partner is determined as the source or the sink.

In the second example, letters "A" and "B" are printed on both sides of a connector portion of the USB cable 30. For example, when the connection direction of the USB connector 130 is face up (when the cc1 terminal of the device 10 is connected to the cc line), the side printed with the letter A faces upward. When the connection direction of the USB connector 130 is face down (when the cc2 terminal of the device 10 is connected to the cc line), the side printed with the letter B faces upward. Note that the user can change setting such that the side printed with the letter B faces upward when the connection direction of the USB connector 130 is face up, and the side printed with the letter A faces upward when the connection direction of the USB connector 130 is face down.

In the second example, the user's act of connecting the USB connector 130 face up (with the side printed with the letter A facing upward) to the connection partner via the USB cable 30 is treated as indication of intention that the user wishes to supply power from the device 10 to the connection partner (in other words, the user wishes to determine the device 10 as the source and the connection partner as the sink). Meanwhile, the user's act of connecting the USB connector 130 face down (with the side printed with the letter B facing upward) to the connection partner via the USB cable 30 is treated as indication of intention that the user wishes to cause the device 10 to receive power from the connection partner (in other words, the user wishes to determine the device 10 as the sink and the connection partner as the source).

The CPU 100 determines whether the power transmission direction corresponding to the connection direction of the USB connector 130 (in other words, the power transmission direction intended by the user) matches the current power transmission direction (step S23).

When the CPU 100 determines that the power transmission direction corresponding to the connection direction of the USB connector 130 matches the current power transmission direction (step S23: YES), in step S24, the CPU 100 negotiates with the connection partner but does not request the connection partner to change the power transmission direction (in other words, does not request the connection partner to swap the source and the sink).

When the CPU 100 determines that the power transmission direction corresponding to the connection direction of the USB connector 130 does not match the current power transmission direction (step S23: NO), in step S25, the CPU 100 negotiates with the connection partner, requests the connection partner to change the power transmission direction, and changes the power transmission direction to the reverse direction (in other words, swaps the source and the sink) through communications with the connection partner in response to the change request.

In this way, in the second example, the power transmission direction between the device and the connection partner can be switched to the direction intended by the user by simpler processing than the first example without using an operation unit.

The above is description of the illustrative embodiments of the present invention. The embodiments of the present invention are not limited to those described above, and various modifications can be made within the scope of the technical idea of the present invention. For example, appropriate combinations of the embodiments and the like clearly exemplified in the specification or obvious embodiments are also included in the embodiments of the present application. Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. An electronic device, comprising:
   a power supply;
   a connector configured to be alternatively connectable in a first direction and in a second direction;
   a detector configured to detect in which of the first direction and the second direction the connector is currently connected; and
   circuitry configured to switch a state of the electronic device between a first state to supply power to another device and to a second state to receive power from said another device,
   wherein the circuitry is further configured to switch the state of the electronic device to the first state or the second state based on both a current connection direction of the connector detected by the detector and a previous connection direction of the connector detected by the detector prior to detecting the current connection direction.

2. The electronic device according to claim 1,
wherein the circuitry is further configured to determine whether the previous connection direction of the connector detected by the detector matches a current connection direction of the connector detected by the detector when the connector is connected to said another device after previous connection of the connector with said another device is released, and
wherein the circuitry is further configured to switch the state of the electronic device from the first state to the second state or from the second state to the first state when determining that the previous connection direction of the connector does not match the current connection direction of the connector.

3. The electronic device according to claim 2,
wherein the circuitry is further configured to determine whether a previous state of the electronic device matches a current state of the electronic device, and
wherein the circuitry is further configured to switch the state of the electronic device from the first state to the second state or from the second state to the first state when determining that the previous connection direction of the connector does not latch the current connection direction of the connector and the previous state of the electronic device matches the current state of the electronic device.

4. The electronic device according to claim 2, further comprising a timer to measure an elapsed time from when the previous connection of the connector with said another device is released to when the current connection of the connector with said another device is established,
wherein the circuitry is further configured to not switch the state of the electronic device when the elapsed time measured by the timer exceeds a threshold time even when determining that the previous connection direction of the connector does not match the current connection direction of the connector.

5. The electronic device according to claim 2, further comprising a memory to store identification information of said another device connected to the connector,
wherein the circuitry is further configured to not switch the state of the electronic device when the identification information of said another device previously connected to the connector does not match the identification information of said another device currently connected to the connector even when determining that the previous connection direction of the connector does not match the current connection direction of the connector.

6. The electronic device according to claim 5,
wherein the memory stores the identification information of said another device connected to the connector when said another device connected to the connector is an electronic device that includes a power supply and is capable of supplying power to an external device and receiving power from the external device.

7. An electronic device, comprising:
a power supply;
a connector configured to be alternatively connectable in a first direction and in a second direction a detector configured to detect in which of the first direction and the second direction the connector is currently connected; and
circuitry configured to switch a state of the electronic device between a first state to supply power to another device and to a second state to receive power from said another device,
wherein the circuitry is further configured to set the state of the electronic device to the first state or the second state based on a connection direction of the connector detected by the detector and an elapsed time from a previous connection of the connector.

8. A method to be executed by an electronic device, the method comprising:
detecting in which of a first direction and a second direction a connector of the electronic device is currently connected to another device; and
switching a state of the electronic device between a first state to supply power to said another device and a second state to receive power from said another device,
wherein the switching step includes switching the state of the electronic device to the first state or the second state based on both a currently detected connection direction of the connector and a previously detected connection direction of the connector.

9. The electronic device of claim 1, wherein the circuitry is further configured to switch the state of the electronic device based on identification information of a connection partner of the previous connection.

* * * * *